(12) United States Patent
Li et al.

(10) Patent No.: US 11,798,911 B1
(45) Date of Patent: Oct. 24, 2023

(54) FORCE SENSOR IN AN ULTRASONIC WIRE BONDING DEVICE

(71) Applicant: ASMPT SINGAPORE PTE. LTD., Singapore (SG)

(72) Inventors: Hing Leung Li, Hong Kong (CN); Hoi Ting Lam, Hong Kong (CN); Tsz Kit Yu, Hong Kong (CN); Ly Tat Peh, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/727,874

(22) Filed: Apr. 25, 2022

(51) Int. Cl.
| | |
|---|---|
| *B23K 20/00* | (2006.01) |
| *H01L 23/00* | (2006.01) |
| *B23K 20/10* | (2006.01) |
| *B23K 20/26* | (2006.01) |
| *B23K 101/40* | (2006.01) |

(52) U.S. Cl.
CPC ............ *H01L 24/78* (2013.01); *B23K 20/005* (2013.01); *B23K 20/10* (2013.01); *B23K 20/26* (2013.01); *B23K 2101/40* (2018.08); *H01L 2224/7892* (2013.01); *H01L 2224/78349* (2013.01); *H01L 2224/78353* (2013.01); *H01L 2224/78901* (2013.01)

(58) Field of Classification Search
CPC .......... H01L 24/78; H01L 2224/78349; H01L 2224/78353; H01L 2224/78901; H01L 2224/7892; B23K 20/005; B23K 20/10–106; B23K 20/26; B23K 2101/40; B23K 20/004; B23K 20/007; B29C 65/08

USPC .................... 228/1.1, 110.1, 4.5, 180.5, 904
See application file for complete search history.

(56) References Cited

U.S. PATENT DOCUMENTS

| | | | | |
|---|---|---|---|---|
| 3,827,619 | A * | 8/1974 | Cusick | H01L 24/80 228/103 |
| 3,890,831 | A * | 6/1975 | Cusick | H01L 24/78 73/789 |
| 4,373,653 | A * | 2/1983 | Salzer | B23K 20/10 156/73.2 |
| 5,170,929 | A * | 12/1992 | Long | B23K 20/10 228/264 |
| 5,230,458 | A * | 7/1993 | Asanasavest | H01L 24/78 228/180.5 |
| 5,388,751 | A * | 2/1995 | Harada | B23K 20/004 228/8 |
| 5,435,477 | A * | 7/1995 | Torihata | H01L 24/78 228/49.5 |

(Continued)

FOREIGN PATENT DOCUMENTS

JP          4314313 B1 *  8/2009  .......... B23K 20/007

*Primary Examiner* — Kiley S Stoner
(74) *Attorney, Agent, or Firm* — OSTROLENK FABER LLP

(57) ABSTRACT

A force sensor for determining a bonding force during wire bonding operations includes: a piezoelectric sensing element mounted in an ultrasonic transducer of an ultrasonic wire bonding device, the piezoelectric sensing element including a first portion and a second portion, and first and second opposing surfaces, wherein the first surface of the first portion has a positive electrode and the second surface of the first portion has a negative electrode respectively, and the first surface of the second portion has a negative electrode and the second surface of the second portion has a positive electrode respectively.

12 Claims, 4 Drawing Sheets

(56) References Cited

U.S. PATENT DOCUMENTS

| | | | | |
|---|---|---|---|---|
| 5,603,445 A * | 2/1997 | Hill | | B23K 20/106 228/904 |
| 5,607,096 A * | 3/1997 | Asanasavest | | B23K 20/106 228/110.1 |
| 5,890,643 A * | 4/1999 | Razon | | H01L 24/78 228/1.1 |
| 6,279,810 B1 * | 8/2001 | Chan-Wong | | B23K 31/125 228/8 |
| 6,286,747 B1 * | 9/2001 | Chan | | B06B 1/0261 228/110.1 |
| 6,425,514 B1 * | 7/2002 | Ou | | H01L 24/78 228/110.1 |
| 8,312,606 B2 * | 11/2012 | Reid | | B21J 15/147 411/361 |
| 9,640,512 B2 | 5/2017 | Song | | |
| 10,427,358 B2 * | 10/2019 | Jörn | | B29C 66/21 |
| 10,633,116 B2 * | 4/2020 | Furfari | | B64F 5/10 |
| 11,338,899 B2 * | 5/2022 | Nordman | | B64C 1/069 |
| 2002/0109001 A1 * | 8/2002 | Ou | | B23K 20/10 228/180.5 |
| 2003/0085255 A1 * | 5/2003 | Farassat | | B23K 31/12 228/103 |
| 2003/0146265 A1 * | 8/2003 | Mayer | | H01L 24/78 228/103 |
| 2003/0146267 A1 * | 8/2003 | Mayer | | B23K 20/005 228/180.5 |
| 2005/0184131 A1 * | 8/2005 | Kondo | | B23K 20/005 228/180.5 |
| 2006/0175382 A1 * | 8/2006 | Packer | | B23K 20/1255 228/2.1 |
| 2007/0289389 A1 * | 12/2007 | Stewart | | G01L 9/0052 73/754 |
| 2008/0006674 A1 * | 1/2008 | Chan | | H01L 24/78 228/110.1 |
| 2008/0011809 A1 * | 1/2008 | Seyama | | B23K 20/10 228/1.1 |
| 2009/0218385 A1 * | 9/2009 | Faessler | | B23K 20/10 228/1.1 |
| 2009/0235762 A1 * | 9/2009 | Schaffner | | G01L 1/26 73/862.68 |
| 2010/0127599 A1 * | 5/2010 | Thuerlemann | | B06B 3/00 310/323.18 |
| 2011/0259941 A1 * | 10/2011 | Kim | | H01L 24/78 228/104 |
| 2014/0007705 A1 * | 1/2014 | Campbell | | G01L 1/18 73/862.628 |
| 2014/0131425 A1 * | 5/2014 | Liu | | B23K 3/08 228/104 |

* cited by examiner

FORCE SENSOR IN AN ULTRASONIC WIRE BONDING DEVICE

FIELD OF THE INVENTION

The invention generally relates to force measurement during wire bonding operations for forming electrical interconnections to semiconductor devices, and more specifically to a force sensor for monitoring a bonding force applied by an ultrasonic wire bonding device.

BACKGROUND

Ultrasonic welding is commonly used for wire bonding during the assembly and packaging of semiconductor devices. A force sensor may be used in an ultrasonic wire bonding device to monitor the quality of a wire bond by sensing or measuring a bonding force.

A conventional ultrasonic wire bonding device in a wire bonding apparatus is depicted in U.S. Pat. No. 9,640,512 B2 entitled "Wire Bonding Apparatus Comprising an Oscillation Mechanism". Such a wire bonding device comprises an ultrasonic transducer including a capillary and at least one electrically-driven actuator which has a longitudinal actuation direction.

In some existing ultrasonic wire bonding apparatus, the force sensor or an encoder may be attached to a bond head or a transducer holder of the ultrasonic wire bonding apparatus on which the wire bonding device has been mounted. As the force sensor is typically located far away from the wire bonding tool (such as a capillary), there is a delay in the force sensor detecting a bonding force applied to a bonding surface by the wire bonding tool during wire bonding operations. The accuracy of the bonding force detected is therefore compromised.

It would therefore be beneficial to provide a solution for more effectively and accurately monitoring bonding forces in ultrasonic wire bonding devices during wire bonding operations.

SUMMARY OF THE INVENTION

It is thus an object of the invention to seek to provide an improved force sensor for effectively measuring a bonding force in an ultrasonic wire bonding device during wire bonding operations to obtain more accurate measurement results.

According to a first aspect of the present invention, there is provided a force sensor for determining a bonding force during wire bonding operations. The force sensor includes at least: a piezoelectric sensing element mounted in an ultrasonic transducer of an ultrasonic wire bonding device, the piezoelectric sensing element comprising a first portion and a second portion, first and second opposing surfaces, wherein the first surface of the first portion has a positive electrode and the second surface of the first portion has a negative electrode respectively, and the first surface of the second portion has a negative electrode and the second surface of the second portion has a positive electrode respectively.

With the novel arrangement of electrodes on the piezoelectric sensing element in the proposed force sensor, the contact detection signal arising from application of a bonding force will be a sum of outputs of the piezoelectric sensing element caused by the bonding force during wire bonding operations. Moreover, the outputs of the piezoelectric sensing element caused by driving forces from a piezoelectric driver stack for driving the ultrasonic transducer to vibrate that is exerted on the piezoelectric sensing element will be reduced or even cancelled out. Thus, the bonding force during wire bonding operations can be measured more accurately by the proposed force sensor.

In some embodiments, the piezoelectric sensing element is mounted in the ultrasonic transducer such that the first and the second portions of the piezoelectric sensing element are arranged along a direction perpendicular to a longitudinal direction of the ultrasonic transducer. In one embodiment, the first and second portions of the piezoelectric sensing element are arranged and separated along a vertical orientation such that the bonding force along the vertical direction can be measured accurately. In other words, the first and second portions of the piezoelectric sensing element may be upper and lower portions of the piezoelectric sensing element.

It should be noted that the shape and dimensions of the first and second portions of the piezoelectric sensing element may be the same or different in some embodiments. Preferably, the first and second portions of the piezoelectric sensing element are arranged such that symmetrical positive and negative electrodes are formed on each surface of the piezoelectric sensing element. Here, each surface of the piezoelectric sensing element, i.e., each of the first and second opposing surfaces of the piezoelectric sensing element, may be referable to each of the front and rear surfaces of the piezoelectric sensing element. The front surface of the piezoelectric sensing element may include the first/front surfaces of both the first and second portions of the piezoelectric sensing element, and the rear surface of the piezoelectric sensing element may include the second/rear surfaces of both the first and second portions of the piezoelectric sensing element.

In some embodiments, the piezoelectric sensing element may further include an isolation wall arranged between the first and second portions of the piezoelectric sensing element in order to separate the positive and negative electrodes formed on each surface of the piezoelectric sensing element. In one embodiment, the isolation wall may have a width of 1 mm to 2 mm, e.g., 1.5 mm.

In one embodiment, the piezoelectric sensing element may be preferably located between a horn and a piezoelectric driver stack of the ultrasonic transducer so as to more accurately detect the bonding force during wire bonding operations.

In order to prevent the piezoelectric sensing element from being in electrical contact with electrically-conducting surfaces in the ultrasonic transducer, e.g., the horn and piezoelectric driver stack of the ultrasonic transducer, the force sensor may further include a first insulation plate disposed between the piezoelectric sensing element and the horn of the ultrasonic transducer, and a second insulation plate disposed between the piezoelectric sensing element and the piezoelectric driver stack of the ultrasonic transducer. Specifically, the first insulation plate is located between the front surface of the piezoelectric sensing element and the horn, and the second insulation plate is located between the rear surface of the piezoelectric sensing element and the piezoelectric driver stack.

In some embodiments, the force sensor may further include a fixing mechanism which is threaded through an opening coaxially formed in each of the piezoelectric sensing element, the first and second insulation plates and the piezoelectric driver stack for fixing the piezoelectric sensing element, the first and second insulation plates and the piezoelectric driver to the horn of the ultrasonic transducer.

In one embodiment, the fixing mechanism may include a screw. The opening formed on each of the piezoelectric sensing element, the first and second insulation plates and the piezoelectric driver stack may comprise a central hole formed thereon. It should be noted that the fixing mechanism in this embodiment is used to install both the force sensor and the ultrasonic transducer in which the force sensor is mounted. However, in other embodiments, the force sensor and the ultrasonic transducer may be installed by different fixing mechanisms.

In some embodiments, the force sensor may further include a first conductive plate installed to contact the first surface of the piezoelectric sensing element, e.g., the front surface of the piezoelectric sensing element, and a second conductive plate installed to contact the second surface of the piezoelectric sensing element, e.g., the rear surface of the piezoelectric sensing element. In one embodiment, the first and second conductive plates may have cross sectional areas with the same shape and dimensions as the first or second surface of the piezoelectric sensing element such that the first and second surfaces of the piezoelectric sensing element are fully contacted by the first and second conductive plates respectively.

When the force sensor is used for determining a bonding force during a wire bonding operation, the first and second conductive plates may be connected to a charge amplifier for converting current signals from the piezoelectric sensing element to voltage signals.

According to a second aspect of the present invention, there is provided an ultrasonic wire bonding device, the device comprising: an ultrasonic transducer and a piezoelectric sensing element mounted in the ultrasonic transducer, the piezoelectric sensing element comprising a first portion and a second portion, and first and second opposing surfaces, wherein the first surface of the first portion has a positive electrode and the second surface of the first portion has a negative electrode respectively, and the first surface of the second portion has a negative electrode and the second surface of the second portion has a positive electrode respectively.

In some embodiments, the first and second portions of the piezoelectric sensing element may be upper and lower portions of the piezoelectric sensing element, e.g., the first portion is the upper portion and the second portion is the lower portion respectively or vice versa. The first and second opposing surfaces of the piezoelectric sensing element may be the front and rear surfaces of the piezoelectric sensing element respectively or vice versa. In one embodiment, the first and second surfaces of the first portion are the front and rear surfaces of the upper portion of the piezoelectric sensing element respectively, and the first and second surfaces of the second portion are the front and rear surfaces of the lower portion of the piezoelectric sensing element respectively.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENTS OF THE INVENTION

Figure 1A:
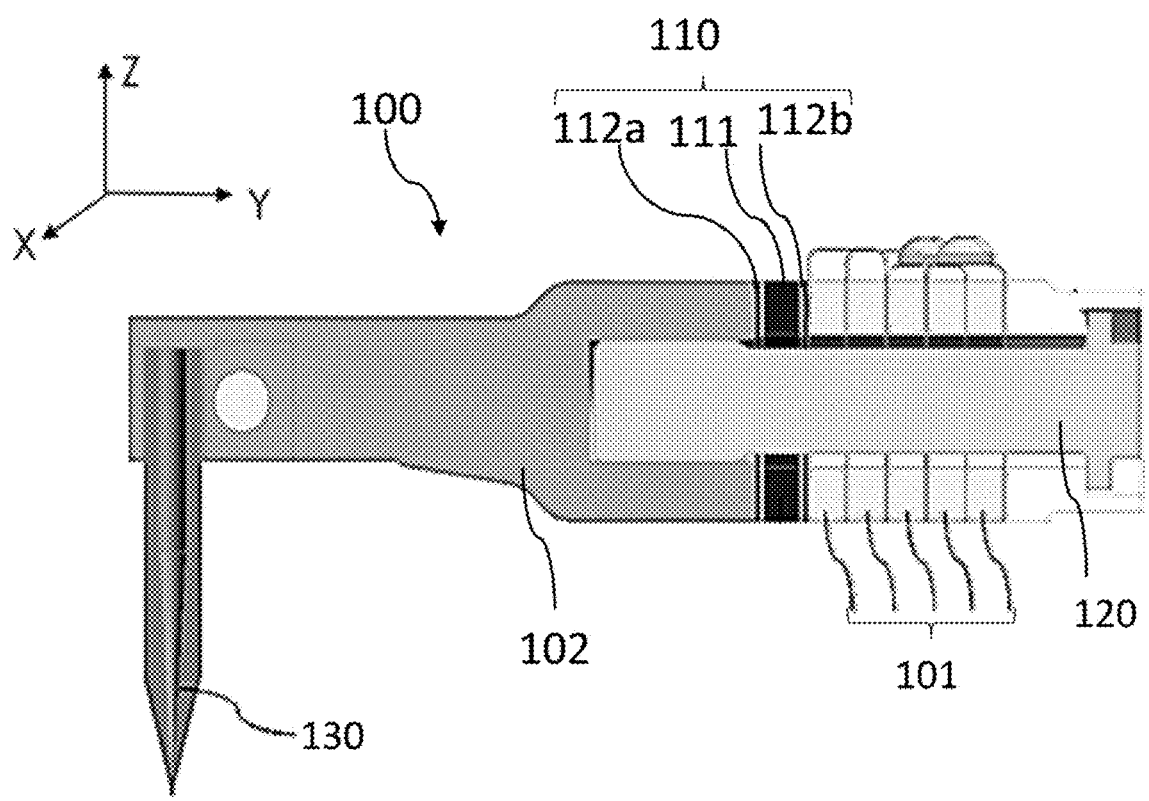
FIG. 1A is a side view of an ultrasonic wire bonding transducer and a force sensor of an ultrasonic wire bonding device according to one embodiment of the invention.

FIG. 1A is a side view of an ultrasonic wire bonding transducer 100 and a force sensor 110 of an ultrasonic wire bonding device according to one embodiment of the invention. As shown in FIG. 1A, the force sensor 110 is mounted, embedded or disposed in the ultrasonic transducer 100.

The ultrasonic transducer 100 includes a piezoelectric driver stack 101, a horn 102, a fixing mechanism 120 and a bonding tool 130 which may be in the form of a capillary attached to the horn 102 for generating ultrasonic energy at the capillary tip. The piezoelectric driver stack 101 includes a plurality of piezoelectric elements, e.g., five piezoelectric elements, configured for driving the ultrasonic transducer 100 to move along a direction substantially parallel to a longitudinal direction of the ultrasonic transducer 100, e.g., the Y-axis direction as shown in FIG. 1A.

The force sensor 110 is mounted between the piezoelectric driver stack 101 and the horn 102 of the ultrasonic transducer 100, and includes a piezoelectric sensing element 111 and two insulation plates, i.e., a first insulation plate 112a and a second insulation plate 112b. The insulation plates 112a, 112b may be made from an insulating material, e.g., paper, plastic, rubber, etc. Referring to FIG. 1A, the piezoelectric sensing element 111 is disposed and sandwiched between the first and second insulation plates 112a, 112b to keep the piezoelectric sensing element 111 from electrically contacting other electrical conductors in the ultrasonic transducer 100, e.g., the horn 102 and the piezoelectric driver stack 101 of the ultrasonic transducer 100. Specifically, the first insulation plate 112a is located between the piezoelectric sensing element 111 and the horn 102 of the ultrasonic transducer 100, and the second insulation plate 112b is located between the piezoelectric sensing element 111 and the piezoelectric driver stack 101. In this embodiment, the insulation plates 112a, 112b may have a same cross sectional area as the piezoelectric sensing element 111 in a plane perpendicular to the longitudinal direction of the ultrasonic transducer 100, i.e., in an XZ-plane perpendicular to the Y-axis direction, so that the insulation plates 112a, 112b can effectively separate the piezoelectric sensing element 111 from the horn 102 and the piezoelectric driver stack of the ultrasonic transducer 100.

The fixing mechanism 120 of the ultrasonic transducer 100, which may be in the form of a screw, is threaded through an opening coaxially formed in each of the piezoelectric sensing element 111, the first and second insulation plates 112a, 112b and the piezoelectric driver stack 101 for fixing the piezoelectric driver stack 101 and the force sensor 110 to the horn 102 of the ultrasonic transducer 100. The cross-sectional shape and dimensions in the XZ plane of the openings formed on each of the piezoelectric sensing element 111, the first and second insulation plates 112a, 112b and the piezoelectric driver stack 101 may correspond to the cross-sectional shape and dimensions of the fixing mechanism 120 in its longitudinal direction. In this embodiment, the opening may be a central hole formed on each of the piezoelectric sensing element 111, the first and second insulation plates 112a, 112b and the piezoelectric driver stack 101.

Figure 1B:
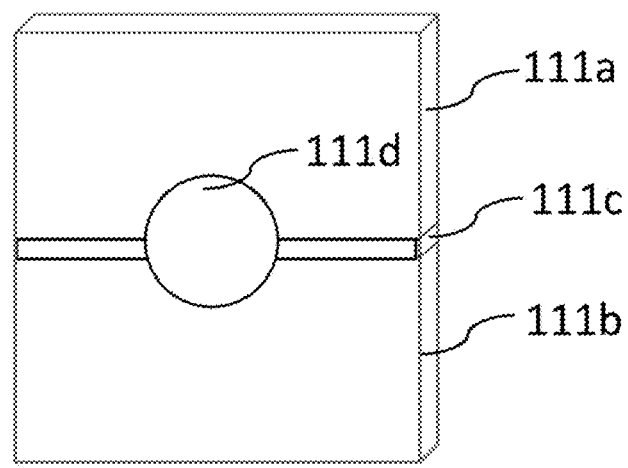
FIG. 1B shows a perspective view of a piezoelectric sensing element of the force sensor in the ultrasonic wire bonding transducer as shown in FIG. 1A according to one embodiment of the invention.

FIG. 1B shows a perspective view of the piezoelectric sensing element 111 of the force sensor 110 according to one embodiment of the invention. As shown in FIG. 1B, the piezoelectric sensing element 111 includes an upper portion 111a, a lower portion 111b, an isolation wall 111c between the upper portion 111a and the lower portion 111b and a central hole 111d. Each of the upper and lower portions 111a, 111b has front and rear opposing surfaces. Accordingly, the front surface of the piezoelectric sensing element 111 includes the front surfaces of both the upper and lower portions 111a, 111b, and the rear surface of the piezoelectric sensing element 111 includes the rear surfaces of both the upper and lower portions 111a, 111b. The central hole 111d is provided to allow the fixing mechanism 120 to pass through the central hole 111d to fix the piezoelectric sensing element 111 to the horn 102 of the ultrasonic transducer 100.

Figure 1C:
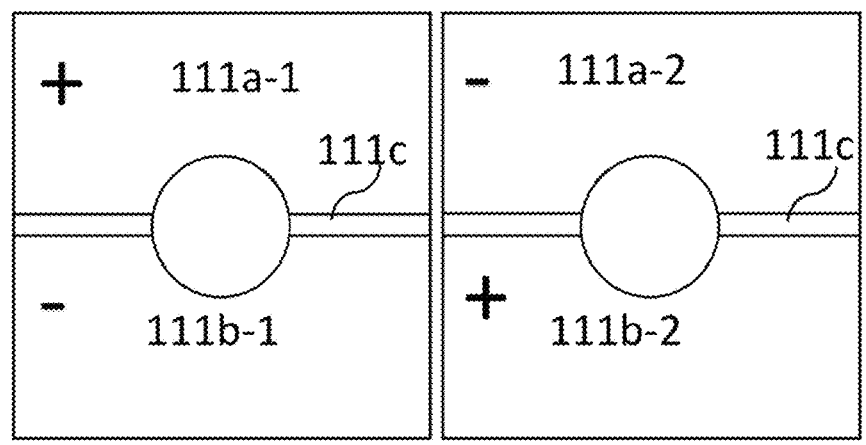
FIG. 1C shows front and rear views respectively of the piezoelectric sensing element of FIG. 11.

FIG. 1C shows front and rear views respectively of the piezoelectric sensing element 111 of the force sensor 110 according to the embodiment. Referring to FIG. 1C, in this embodiment, the front surface 111a-1 of the upper portion 111a has a positive electrode and the rear surface 111a-2 of the upper portion 111a has a negative electrode respectively; and the front surface 111b-1 of the lower portion 111b has a negative electrode and the rear surface 111b-2 of the lower portion 111b has a positive electrode respectively. Alternatively, the electrodes on the upper portion 111a and the lower portion 111b may be arranged in a reverse polarity, i.e., the front surface 111a-1 of the upper portion 111a may have a negative electrode and the rear surface 111a-2 of the upper portion 111a may have a positive electrode respectively; and the front surface 111b-1 of the lower portion 111b may have a positive electrode and the rear surface 111b-2 of the lower portion 111b may have a negative electrode respectively.

The isolation wall 111c of the piezoelectric sensing element 111 is provided for separating the positive and negative electrodes formed on the piezoelectric sensing element 111. The isolation wall 111c may have a width of 1 mm to 2 mm, e.g., 1.5 mm. The narrower the width of the isolation wall 111c, the better the performance of the piezoelectric sensing element 111 is likely to be.

Figure 1D:
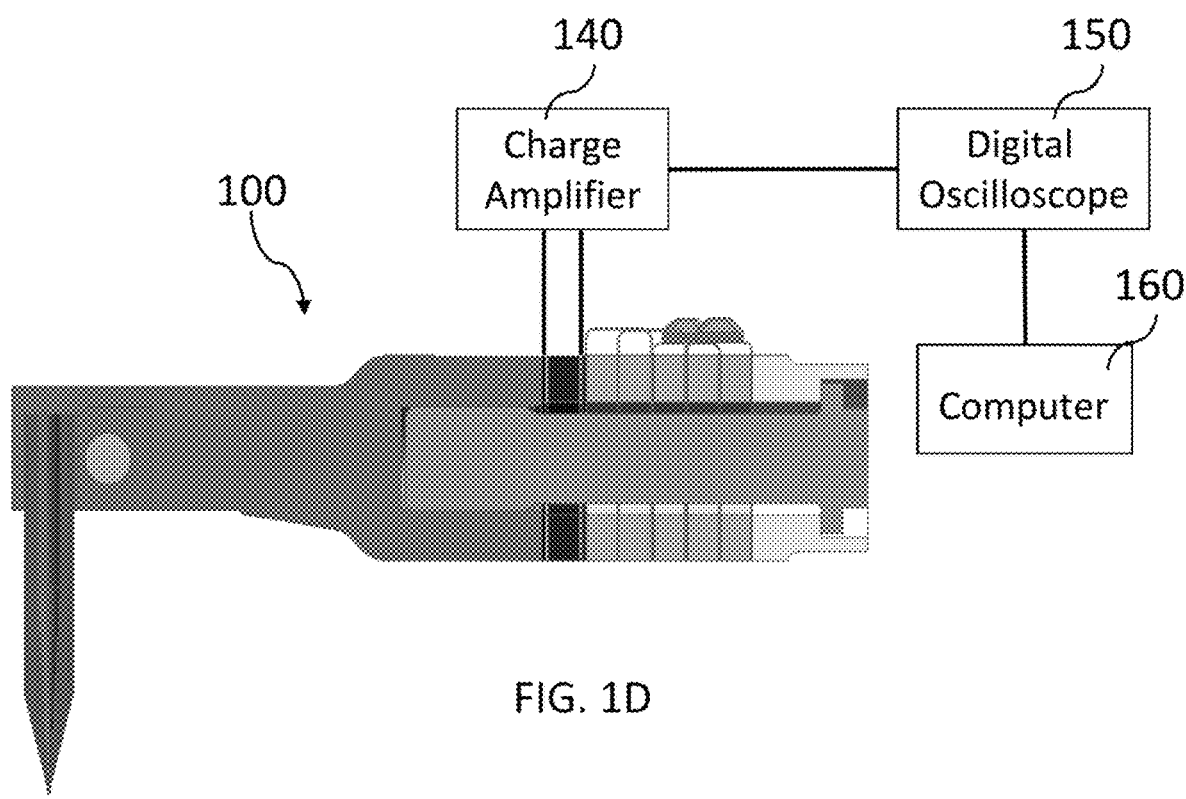
FIG. 1D is a schematic diagram showing a force evaluation system connected to the force sensor of the ultrasonic wire bonding device as shown in FIG. 1A for contact detection during wire bonding operations according to one embodiment of the invention.

FIG. 1D is a schematic diagram showing a force evaluation system connected to the force sensor 110 of the wire bonding device for bonding force detection during wire bonding operations according to one embodiment of the invention. As shown in FIG. 1D, the force evaluation system includes (i) a charge amplifier 140 electrically connected to respective front and rear opposing surfaces of the piezoelectric sensing element 111 of the force sensor 110 for converting current signals from the piezoelectric sensing element 111 to equivalent voltage signals, (ii) a digital oscilloscope 150 connected to the charge amplifier 140 for receiving and processing the voltage signals from the charge amplifier 140 to generate a test result, e.g., a force value, and (iii) a computer or processor 160 is configured to provide an interface for an operator to view the test result.

Figure 1E:
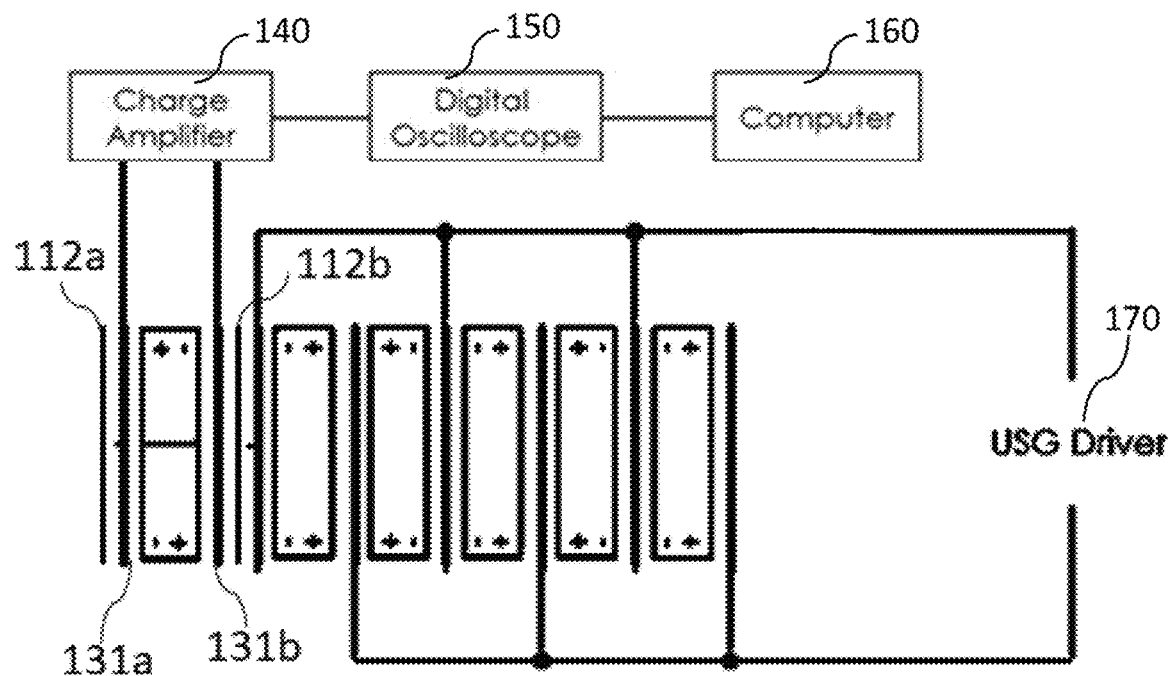
FIG. 1E is a schematic diagram illustrating an electrical connection between the piezoelectric sensing element of the force sensor and a charge amplifier in the force evaluation system of FIG. 1D.

FIG. 1E is a schematic diagram illustrating an electrical connection between the piezoelectric sensing element 111 of the force sensor 110 and the charge amplifier 140 as shown in FIG. 1D. Referring to FIG. 1E, a first conductive plate 131a is positioned between the piezoelectric sensing element 111 and the first insulation plate 112a to contact the front surface of the piezoelectric sensing element 111 to transfer the electrical current signals generated by the electrodes on the front surface of the piezoelectric sensing element 111 to the charge amplifier 140, and a second conductive plate 131b is placed between the piezoelectric sensing element 111 and the second insulation plate 112b to contact the rear surface of the piezoelectric sensing element 111 to transfer the electrical current signals generated by the electrodes on the rear surface of the piezoelectric sensing element 111 to the charge amplifier 130. As shown in FIG. 1E, the piezoelectric driver stack 101 in this embodiment includes five piezoelectric elements which are electrically connected to an ultrasonic signal generator (USG) driver 170. The piezoelectric driver stack 101 is operated to drive the ultrasonic transducer 100 to oscillate or vibrate along a horizontal direction, e.g., the Y-axis direction, such that the bonding tool 130 attached to the horn 102 is moved along the horizontal direction.

Figure 2:
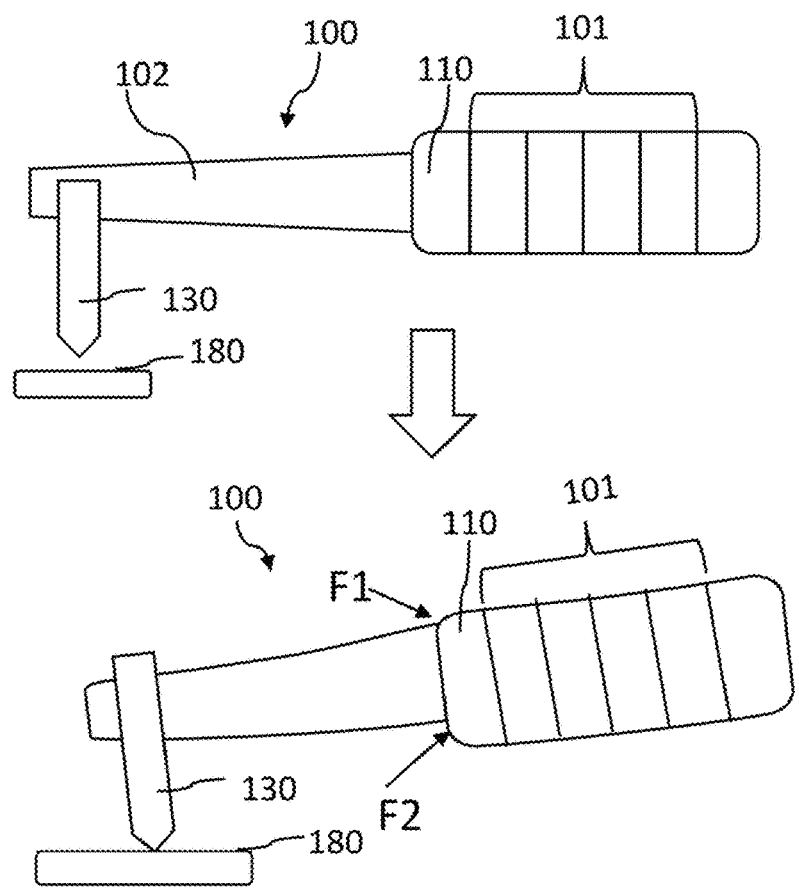
FIG. 2 is a side view of the ultrasonic transducer and force sensor of the ultrasonic wire bonding device prior to and after making contact with a bonding surface when it is being used for wire bonding operations according to one embodiment of the invention.

FIG. 2 shows schematic side views of the ultrasonic wire bonding transducer 100 and force sensor 110 prior to and after making contact with a bonding surface 180 when it is being used for wire bonding operations according to one embodiment of the invention. Referring to FIG. 2, when the bonding tool 130 is moved to contact a bonding surface 180, a reaction force is experienced and received by the piezoelectric sensing element 111 through the bonding tool 130 and the horn 102 of the ultrasonic transducer 100. When the reaction force is received by the piezoelectric sensing element 111, a compression force F1 is applied to the upper portion 111a of the piezoelectric sensing element 111, and a corresponding tensile force F2 is received by the lower portion 111b of the piezoelectric sensing element 111.

Figure 3:
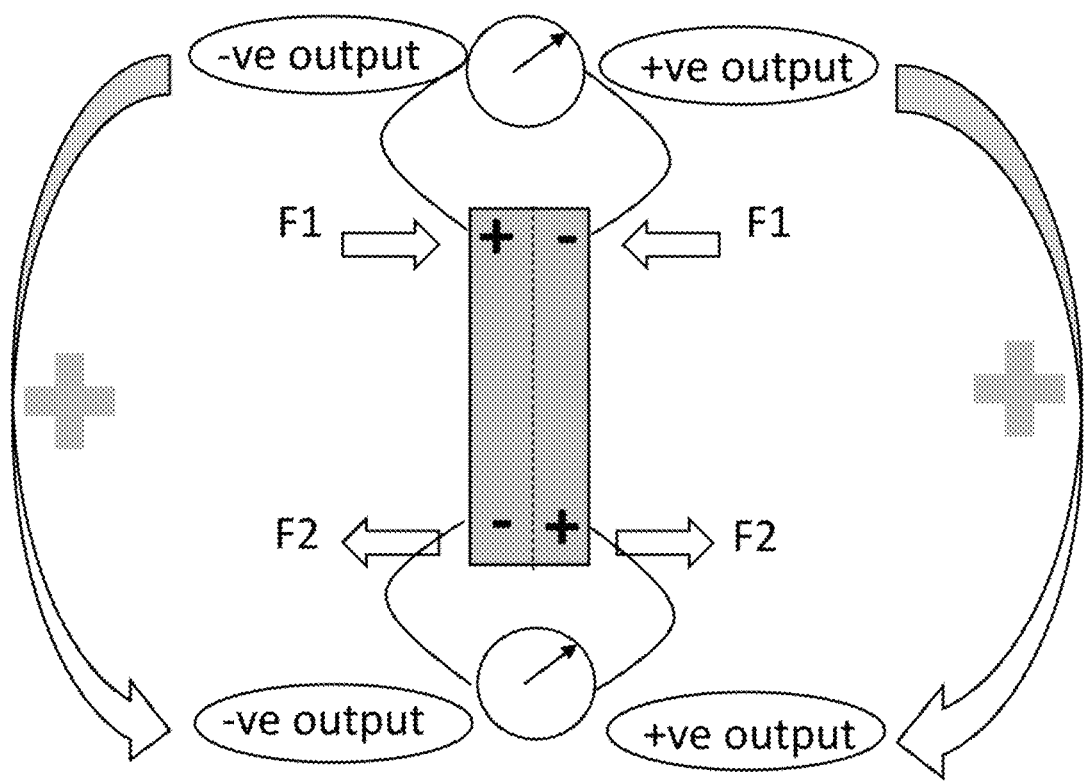
FIG. 3 is a schematic diagram illustrating an output signal generated by the piezoelectric sensing element of the force sensor when a reaction force is received by the piezoelectric sensing element during a wire bonding operation.

FIG. 3 is a schematic diagram illustrating an output signal generated by the piezoelectric sensing element 111 of the force sensor 110 when the reaction force is received by the piezoelectric sensing element 111. Due to the arrangement of electrodes on the upper and lower portions 111a, 111b of the piezoelectric sensing element 111, the output signal of the piezoelectric sensing element 111 will be a sum of the outputs generated by the compression force received by the upper portion 111a of the piezoelectric sensing element 111, and the outputs generated by the tensile force applied to the lower portion 111b of the piezoelectric sensing element 111. In other words, with the novel arrangement of electrodes of opposite polarities arranged on upper and lower portions 111a, 111b of the piezoelectric sensing element 111, the output signal of the piezoelectric sensing element 111 generated by the reaction force will be a superposition of the outputs generated by the compression force applied to the upper portion 111a of the piezoelectric sensing element 111 and the outputs generated by the tensile force applied to the lower portion 111b of the piezoelectric sensing element 111. Furthermore, with the novel arrangement of electrodes on the piezoelectric sensing element 111, the outputs generated by driving forces applied to the piezoelectric sensing element 111 by the piezoelectric driver stack 101 will be weakened, even cancelled out. Therefore, the bonding force applied to the bonding surface 180 can be accurately determined based on the output signal from the piezoelectric sensing element 111.

As will be appreciated from the above description, embodiments of the invention provide a force sensor for accurately monitoring bond forces in an ultrasonic wire bonding device during wire bonding operations. The force sensor includes a piezoelectric sensing element embedded in the ultrasonic transducer of the ultrasonic wire bonding machine. In order to effectively and accurately conduct contact detection during wire bonding operations, the piezoelectric sensing element is designed to have a novel arrangement of electrodes, i.e., both positive and negative electrodes are arranged on each of two opposing surfaces of the piezoelectric sensing element and different electrodes are arranged on two opposing surfaces of each of two separated portions of the piezoelectric sensing element. With this novel arrangement of electrodes on the piezoelectric sensing element, the output signal of the piezoelectric sensing element caused by the bonding force will be significantly amplified, while the output signal of the piezoelectric sensing element caused by the driving force produced by the piezoelectric driver stack will be attenuated or cancelled. The bonding force detection during wire bonding operations thereby can be effectively and accurately conducted. Further, due to the arrangement of electrodes on the piezoelectric sensing element, only a simple electrical connection between the piezoelectric sensing element and a charge amplifier is required to receive the output signals from the piezoelectric sensing element.

Although the present invention has been described in considerable detail with reference to certain embodiments, other embodiments are possible. Therefore, the spirit and scope of the appended claims should not be limited to the description of the embodiments contained herein.

The invention claimed is:

1. A force sensor for determining a bonding force during wire bonding operations, the force sensor comprising:
   a piezoelectric sensing element mounted in an ultrasonic transducer of an ultrasonic wire bonding device, the piezoelectric sensing element comprising a first portion and a second portion, and first and second opposing surfaces,
   wherein the first opposing surface of the first portion has a positive electrode and the second opposing surface of the first portion has a negative electrode respectively,
   the first opposing surface of the second portion has a negative electrode and the second opposing surface of the second portion has a positive electrode respectively, and
   the piezoelectric sensing element is mounted in the ultrasonic transducer such that the first and second portions are arranged along a direction perpendicular to a longitudinal direction of the ultrasonic transducer.

2. The force sensor according to claim 1, wherein the first second portions of the piezoelectric sensing element are arranged and separated along a vertical orientation.

3. The force sensor according to claim 2, wherein the first and second portions are arranged such that symmetrical positive and negative electrodes are formed on each of the first and second opposing surfaces of the piezoelectric sensing element.

4. The force sensor according to claim 1, wherein the piezoelectric sensing element further comprises an isolation wall arranged between the first portion and the second portion of the piezoelectric sensing element.

5. The force sensor according to claim 4, wherein the isolation wall has a width of 1 mm to 2 mm.

6. The force sensor according to claim 1, wherein the piezoelectric sensing element is located between a horn and a piezoelectric driver stack of the ultrasonic transducer.

7. The force sensor according to claim 6, further comprising a first insulation plate disposed between the piezoelectric sensing element and the horn of the ultrasonic transducer, and a second insulation plate disposed between the piezoelectric sensing element and the piezoelectric driver stack of the ultrasonic transducer.

8. The force sensor according to claim 7, further comprising a fixing mechanism which is threaded through an opening coaxially formed in each of the piezoelectric sensing element, the first and second insulation plates and the piezoelectric driver stack for fixing the piezoelectric sensing element, the first and second insulation plates and the piezoelectric driver to the horn of the ultrasonic transducer.

9. The force sensor according to claim 1, further comprising a first conductive plate installed to contact the first opposing surface of the piezoelectric sensing element, and a second conductive plate installed to contact the second opposing surface of the piezoelectric sensing element.

10. The force sensor according to claim 9, wherein the first and second conductive plates are respectively connected to a charge amplifier for converting current signals from the piezoelectric sensing element to voltage signals.

11. The force sensor according to claim 10, wherein the first and second conductive plates have cross sectional areas with same shape and dimensions as the first and second opposing surfaces of the piezoelectric sensing element, such that the first and second opposing surfaces of the piezoelectric sensing element are fully contacted by the first and second conductive plates respectively.

12. An ultrasonic wire bonding device comprising:
   an ultrasonic transducer and a force sensor, the force sensor comprising a piezoelectric sensing element mounted in the ultrasonic transducer, the piezoelectric sensing element comprising a first portion and a second portion, and first and second opposing surfaces,
   wherein the first opposing surface of the first portion has a positive electrode and the second opposing surface of the first portion has a negative electrode respectively, and
   the first opposing surface of the second portion has a negative electrode and the second opposing surface of the second portion has a positive electrode respectively.

* * * * *